(12) United States Patent
Kaiser et al.

(10) Patent No.: US 10,120,968 B1
(45) Date of Patent: Nov. 6, 2018

(54) SYSTEM AND METHOD FOR HIERARCHICAL LIBRARY SEARCHING

(71) Applicant: Cadence Design Systems, Inc., San Jose, CA (US)

(72) Inventors: Dan Richard Kaiser, Traverse City, MI (US); Jonathan Lee DeKock, Carlisle, MA (US); Steven Guy Esposito, Westford, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 101 days.

(21) Appl. No.: 14/958,179

(22) Filed: Dec. 3, 2015

(51) Int. Cl.
*G06F 17/50* (2006.01)
(52) U.S. Cl.
CPC .................. *G06F 17/5045* (2013.01)
(58) Field of Classification Search
USPC ........................................... 716/101
See application file for complete search history.

(56) References Cited

U.S. PATENT DOCUMENTS

| | | | |
|---|---|---|---|
| 6,591,403 B1* | 7/2003 | Bass | G06F 17/5022 716/102 |
| 7,971,163 B2* | 6/2011 | Goto | G06F 17/504 716/101 |
| 2009/0200875 A1* | 8/2009 | Higuchi | G06F 17/505 307/125 |
| 2014/0189662 A1* | 7/2014 | Mameri | G06F 8/427 717/140 |

* cited by examiner

*Primary Examiner* — Bryce Aisaka
(74) *Attorney, Agent, or Firm* — Mark H. Whittenberg, Esq.; Holland & Knight LLP (57) ABSTRACT

The present disclosure relates to defining and processing hardware description language (HDL) groups. Embodiments may include mapping, using a processor, a set of tool-specific objects into a group graph with one or more groups. Embodiments may also include generating a search order associated with each group. The search order associated with each group may be based upon the hierarchical design configuration of the group graph. Embodiments may further include identifying undefined references from within a first group within the group graph and binding defined references from within the first group to electronic circuit design components. Embodiments may include identifying the undefined references from within a second group within the group graph. The second group may be selected based upon the undefined references and the search order associated with the first group.

20 Claims, 3 Drawing Sheets

FIG. 1

200 mapping, using a processor, one or more tool-specific objects into a group graph with one or more groups

202 generating a search order associated with each of the one or more groups within the group graph, wherein the search order associated with each of the one or more groups is based upon, at least in part, the hierarchical design configuration of the group graph

204 identifying one or more undefined references from within a first group of the one or more groups within the group graph

206 binding one or more defined references from within the first group to one or more electronic circuit design components

208 identifying the one or more undefined references from within a second group of the one or more groups within the group graph, wherein the second group is selected based upon, at least in part, the one or more undefined references and the search order associated with the first group of the one or more groups

SYSTEM AND METHOD FOR HIERARCHICAL LIBRARY SEARCHING

FIELD OF THE INVENTION

The present disclosure relates to processing hardware description language (HDL) groups with a hierarchical HDL library search mechanism.

DISCUSSION OF THE RELATED ART

Traditional HDL binding rules for looking up names in libraries is both difficult to use and computationally expensive. Library binding can pose a problem when attempting to employ scalable parallelism. The binding rules of many current systems are global and serial, making it difficult to correctly specify the configuration of a design built up of many hierarchical components. In addition, serial binding rules limit scalability and performance. Moving away from a global serial algorithm may require an alternative for specifying the binding rules and resolving name collisions.

SUMMARY

In one or more embodiments of the present disclosure, a computer-implemented method for defining and processing hardware description language (HDL) groups is provided. The method may include mapping, using a processor, one or more tool-specific objects into a group graph with one or more groups. The method may further include generating a search order associated with each of the one or more groups within the group graph. In some embodiments, the search order associated with each of the one or more groups may be based upon, at least in part, the hierarchical design configuration of the group graph. The method may also include identifying one or more undefined references from within a first group of the one or more groups within the group graph. The method may further include binding one or more defined references from within the first group to one or more electronic circuit design components. The method may also include identifying the one or more undefined references from within a second group of the one or more groups within the group graph. In some embodiments, the second group may be selected based upon, at least in part, the one or more undefined references and the search order associated with the first group of the one or more groups.

One or more of the following features may be included. The method may further include acquiring the second group from the one or more groups of the group graph partially concurrently with the identification of the one or more undefined references. The method may also include generating a library catalog with information acquired during the identification of the one or more undefined references from within the first group and the identification of the one or more undefined references from within the second group. The method may further include identifying the one or more undefined references from within a subset of the one or more groups based upon, at least in part, the information within the library catalog. The method may also include binding a second set of defined references from within the second group to one or more electronic circuit design components. In some embodiments, the second set of defined references may include one or more of the undefined references identified from within the second group. The method may further include iteratively acquiring each of the one or more groups partially concurrently with the identification of one or more undefined references. The method may also include iteratively processing the one or more groups until at least one of: each of the one or more undefined references may be defined and each of the one or more groups may be used to identify the one or more undefined references and the one or more undefined references remains undefined. In some embodiments, the search order associated with each of the one or more groups may include one or more search rules that may be altered based upon, at least in part, the setting of one or more parameters and one or more meta-rule directives. In some embodiments, the one or more groups may include at least one of command lines, tool options, file types, filters, an HDL file, an HDL library, an HDL command line, and an HDL include file.

In another embodiment of the present disclosure a system for processing hardware description language (HDL) groups is provided. The system may include a computing device having at least one processor configured to map one or more tool-specific objects into a group graph with one or more groups. The at least one processor may also be configured to generate a search order associated with each of the one or more groups within the group graph. In some embodiments, the search order associated with each of the one or more groups may be based upon, at least in part, the hierarchical design configuration of the group graph. The at least one processor may be further configured to identify one or more undefined references from within a first group of the one or more groups within the group graph. The at least one processor may also be configured to bind one or more defined references from within the first group to one or more electronic circuit design components. The at least one processor may be further configured to identify the one or more undefined references from within a second group of the one or more groups within the group graph. In some embodiments, the second group may be selected based upon, at least in part, the one or more undefined references and the search order associated with the first group of the one or more groups.

One or more of the following features may be included. The at least one processor may be further configured to acquire the second group from the one or more groups of the group graph partially concurrently with the identification of the one or more undefined references. The at least one processor may also be configured to generate a library catalog with information acquired during the identification of the one or more undefined references from within the first group and the identification of the one or more undefined references from within the second group. The at least one processor may be further configured to identify the one or more undefined references from within a subset of the one or more groups based upon, at least in part, the information within the library catalog. The at least one processor may also be configured to bind a second set of defined references from within the second group to one or more electronic circuit design components. In some embodiments, the second set of defined references may include one or more of the undefined references identified from within the second group. The at least one processor may be further configured to iteratively acquire each of the one or more groups partially concurrently with the identification of one or more undefined references from the one or more references. The at least one processor may also be configured to iteratively process the one or more groups until at least one of each of the one or more undefined references may be defined and each of the one or more groups may be used to identify the one or more undefined references and the one or more undefined references remains undefined. In some embodiments, the one or more groups may include at least one of command lines, tool options, file types, filters, an HDL file, an HDL library, an HDL command line, and an HDL include file.

In yet another embodiment of the present disclosure a computer-readable storage medium having stored thereon instructions that when executed by a machine result in a number of operations is provided. Some operations may include mapping, using a processor, one or more tool-specific objects into a group graph with one or more groups. Operations may also include generating a search order associated with each of the one or more groups within the group graph. In some embodiments, the search order associated with each of the one or more groups is based upon, at least in part, the hierarchical design configuration of the group graph. Operations may further include identifying one or more undefined references from within a first group of the one or more groups within the group graph. Operations may also include binding one or more defined references from within the first group to one or more electronic circuit design components. Operations may further include identifying the one or more undefined references from within a second group of the one or more groups within the group graph. In some embodiments, the second group may be selected based upon, at least in part, the one or more undefined references and the search order associated with the first group of the one or more groups.

One or more of the following features may be included. Operations may also include acquiring the second group from the one or more groups of the group graph partially concurrently with the identification of the one or more undefined references. Operations may also include generating a library catalog with information acquired during the identification of the one or more undefined references from within the first group and the identification of the one or more undefined references from within the second group. Operations may further include binding a second set of defined references from within the second group to one or more electronic circuit design components, wherein the second set of defined references includes one or more of the undefined references identified from within the second group. Operations may also include iteratively processing the one or more groups until at least one of each of the one or more undefined references may be defined and each of the one or more groups may be used to identify the one or more undefined references and the one or more undefined references remains undefined.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Figure 1:
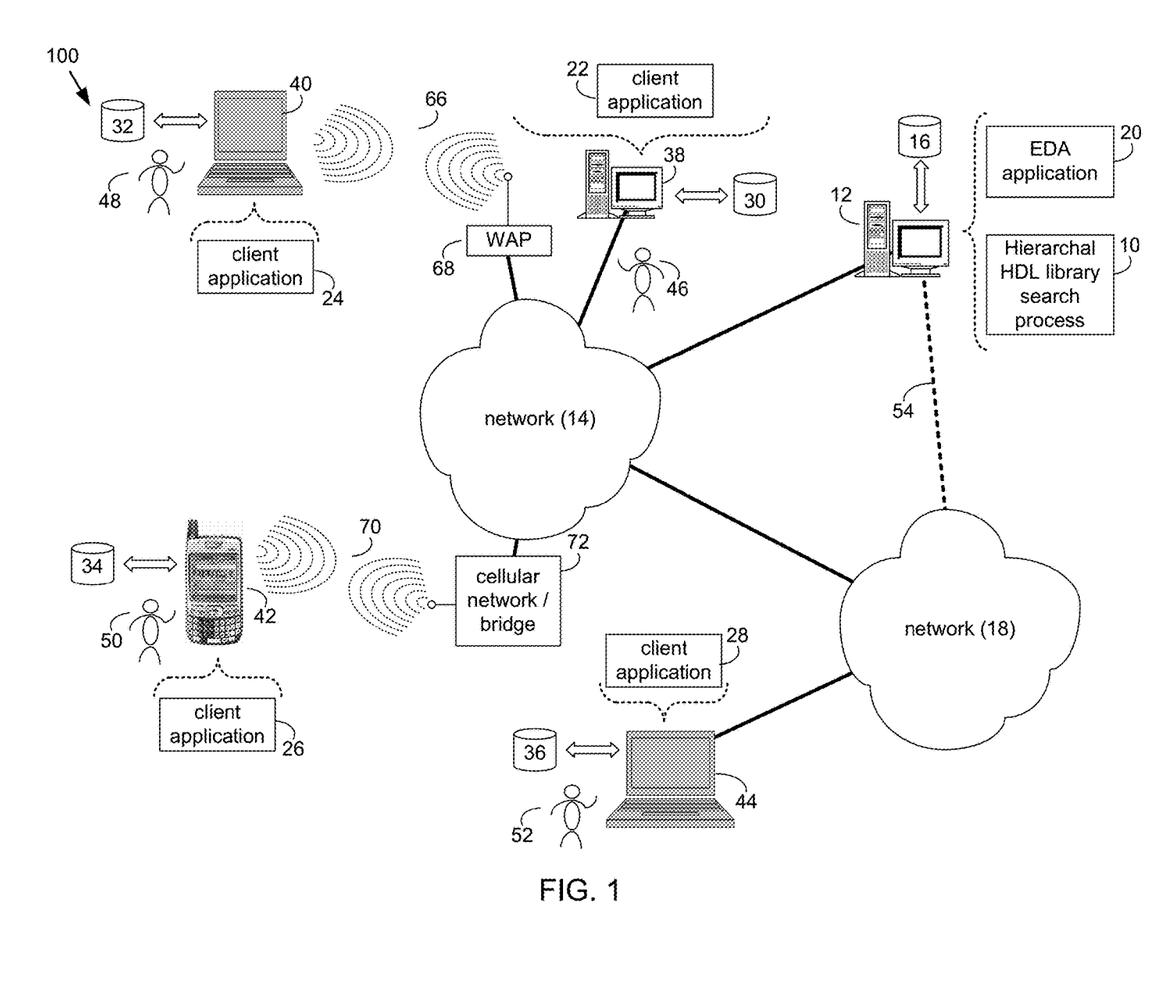
FIG. 1 is a diagram depicting an embodiment of a system in accordance with the present disclosure.

Referring to FIG. 1, there is shown hierarchical HDL library search process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the hierarchical HDL library search process 10 may reside on and be executed, in whole or in part, by a client electronic device, such as a personal computer, notebook computer, personal digital assistant, or the like.

The instruction sets and subroutines of hierarchical HDL library search process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20). EDA application 20 may interact with one or more EDA client applications (e.g., EDA client applications 22, 24, 26, 28) for electronic circuit design.

In some embodiments, hierarchical HDL library search process 10 may be a stand-alone application, or may be an applet/application/script that may interact with and/or be executed within EDA application 20. In addition/as an alternative to being a server-side process, the hierarchical HDL library search process 10 may be a client-side process (not shown) that may reside on a client electronic device (described below) and may interact with an EDA client application (e.g., one or more of EDA client applications 22, 24, 26, 28). Further, the hierarchical HDL library search process 10 may be a hybrid server-side/client-side process that may interact with EDA application 20 and an EDA client application (e.g., one or more of client applications 22, 24, 26, 28). As such, the hierarchical HDL library search process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize hierarchical HDL library search process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

As with most modern computer languages, HDL languages may provide for selective inclusion of portions of a design by looking up symbols or references in external containers or libraries. HDL languages, or the term "HDL", as used herein may include, but is not limited to, Verilog, VHDL, C, C++, and other hardware description languages known in the art. Library binding or binding as used herein may include, but is not limited to, mapping a symbol or reference to one or more electronic circuit design components defined within a library. The rules for when to search for a symbol or reference in a library, as well as where to search, may be determined by a combination of rules determined by language involved, e.g. Verilog, VHDL, C, etc., and tool specific commands. The language specific commands may involve scope and binding rules, which may determine when to search for a symbol in an external library, and may also determine where and how to search. The tool specific rules may involve where to find the libraries in the OS environment, and the order in which to search the libraries. Both language and tool rules may determine how to search for symbols within a library and search order between libraries.

Since one of the goals of modern EDA applications may be scalability, large systems may be expected and planned for. This may include having large sets of symbols to be bound, as well as large number of libraries, which can include multiple bindings for the same symbol. It should be expected that the same binding may be used many times, as well as cases where the binding may not be used at all. In fact, it may be expected that there are libraries included in the set specified where no part of the library will be used.

Figure 2:
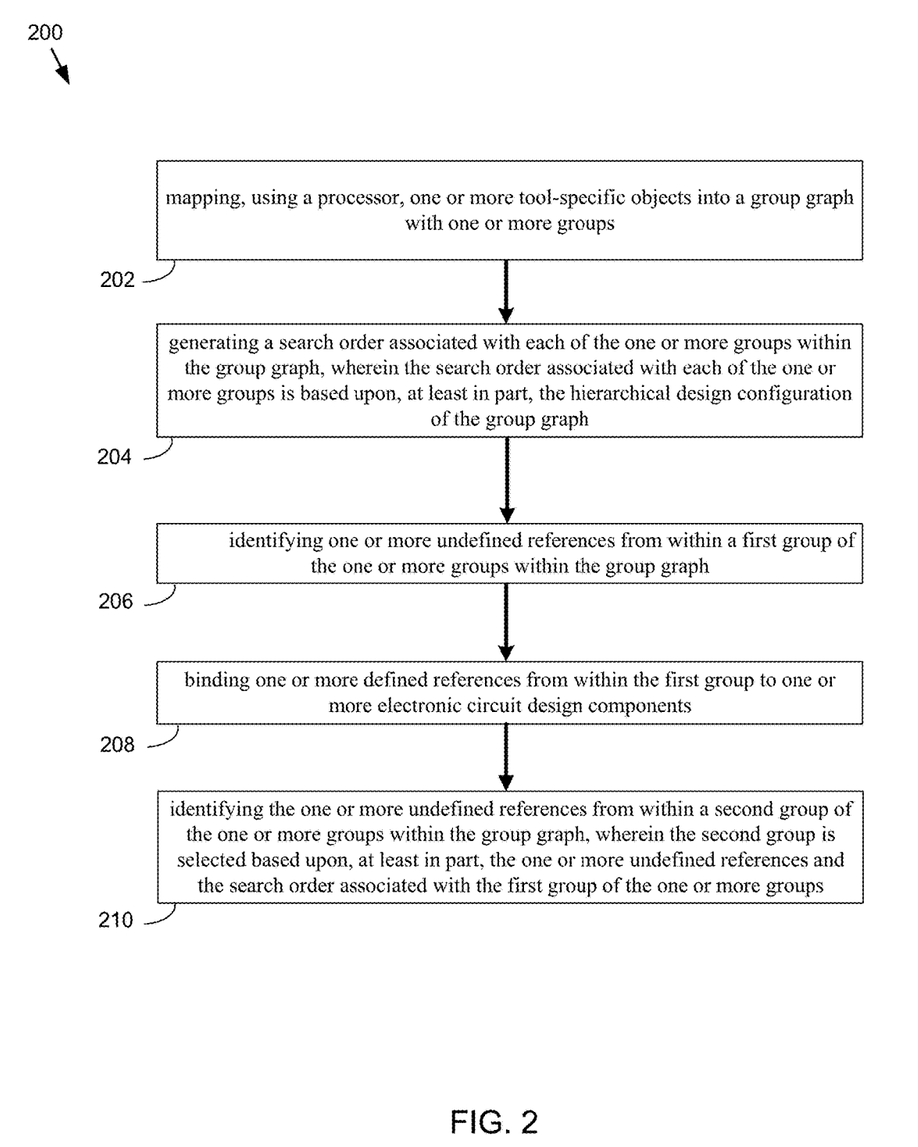
FIG. 2 is a flowchart depicting operations incorporating the hierarchical HDL library search process in accordance with an embodiment of the present disclosure.

Referring also to FIG. 2, in some embodiments and as will be discussed below in greater detail, hierarchical HDL library search process 200 may map (202), using a processor, one or more tool-specific objects into a group graph with one or more groups. Hierarchical HDL library search process 200 may also generate (204) a search order associated with each of the one or more groups within the group graph. Hierarchical HDL library search process 200 may also identify (206) one or more undefined references from within a first group of the one or more groups within the group graph. Hierarchical HDL library search process 200 may further bind (208) one or more defined references from within the first group to one or more electronic circuit design components. Hierarchical HDL library search process 200 may also identify (210) the one or more undefined references from within a second group of the one or more groups within the group graph.

In some embodiments, hierarchical HDL library search process 200 may include mapping (202), using a processor, one or more tool-specific objects into a group graph with one or more groups. In some embodiments, the one or more groups may include, but are not limited to, at least one tool-specific object. Tool-specific objects as used herein may include, but are not limited to command lines, tool options, file types, filters, an HDL file, an HDL library, an HDL command line, an HDL include file, or any other component used in constructing an HDL design. As a group may include a library, the term "library" as used herein may be used in place of "group", where appropriate and within the scope of the present disclosure.

Figure 3:
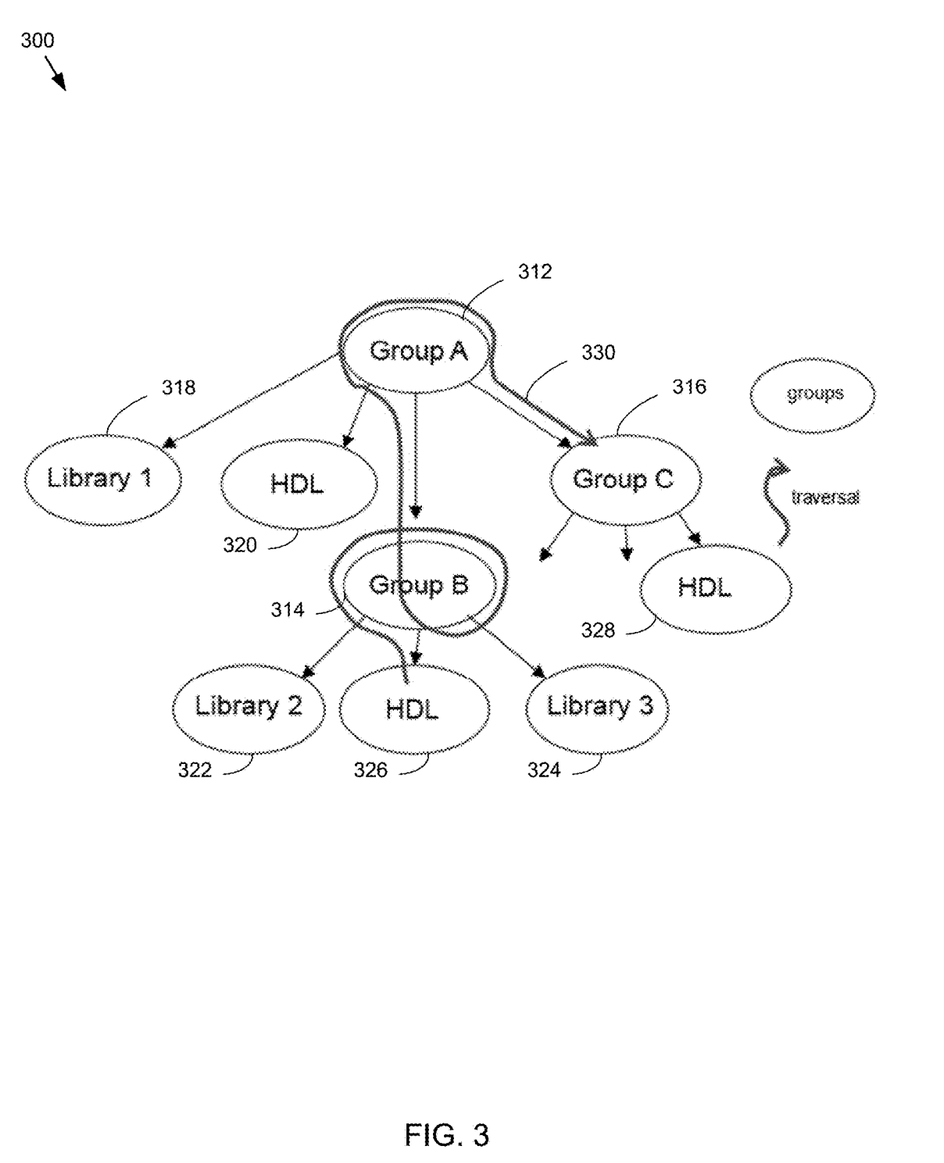
FIG. 3 is a diagram depicting a group graph in accordance with an embodiment of the present disclosure.

Referring also to FIG. 3, in some embodiments, a group 312 may contain, but is not limited to, one or more sub groups 314, 316, library information 318, and design information 320. Library information 318 may include, but is not limited to, library content. Library content may be contained directly or indirectly within the group. In one example, a group 312 can indirectly contain library content when the group 312 contains a sub group 314 that directly contains the library content 322, 324. Design information 320, 326, 328 can include HDL specifications and HDL designs. In some embodiments, one or more groups can be arranged as nodes in a group graph 300. As shown in FIG. 3, the directed edges of the group graph can represent containment or ownership. The arrangement of the group graph 300 can be flexible. In some embodiments, the arrangement of the group graph 300 can be predefined. The arrangement of the group graph 300 can be also be determined by one or more command line options. In some embodiments, the arrangement of the group graph 300 can be determined by the order of one or more libraries and/or one or more HDL specifications on a command line. In one example, different portions of an HDL design can be located at different positions within the group graph 300. In other words, design elements 320, 326, 328 within a group graph 300 may not necessarily be placed in a single position. Library 1 318, Library 2 322, Library 3 324, and HDLs 320, 326, 328 may each be a design unit. A design unit as used herein may include, but is not limited to, a module, program, interface, primitive, or package. A "design unit" may be what Verilog calls a "compilation unit".

In some embodiments, there may be structure in existing design HDL configuration options which can be leveraged to provide precise control of the hierarchical HDL library search process 200. In large designs, the structure of the design configuration options may themselves provide the basic information which can be used to drive the hierarchical HDL library search process 200. For instance, a library may provide one container specifying a set of associated definitions. Beyond that, a set of libraries given together on a single command line may provide another set of associations. In one example, tool options may be grouped into an include file using a –f option, which may provide another grouping. The –f option and/or –f command file as used herein may include, but is not limited to, a text file that is specified following the option. The text file may contain source text filenames and HDL command options. The structure of tool-specific objects may be used to drive the hierarchical HDL library search process 200. As each library is processed, the position of the library in the configuration of one or more commands may be retained. In some embodiments, as tool-specific objects are processed, the structure of the tool-specific objects may be maintained by the group graph 300. References formed by the use of a library name or the name of a tool-specific object include file may be retained in the group graph 300 as a contained in link. In another example, if a library is referenced within a –f command file, the structure may be a library within a file within a command line. The hierarchical HDL library search process may start at the position of the source file containing an undefined reference, which may be in the command line or in a –f command file, which may determine which libraries are encountered and in what order. The order in which the libraries of the command line are encountered can be used, at least in part, to map and/or populate the group graph.

In some embodiments, retaining the command line structure may allow the hierarchical nature of typical HDL configurations to be naturally specified. Current large chip designs may be built up from IP blocks which may in turn be constructed from smaller blocks. This may naturally lead to a hierarchical organization, which may be retained in the description of the design. The order of construction of the design may be reflected in the command line structure specifying the design configuration, and this may be followed in the hierarchical HDL library search process 200. In other words, the arrangement of the group graph 300 may be determined based upon, at least in part, the hierarchical command line structure, as described above. The hierarchical design configuration of the group graph as used herein may include, but is not limited to, an arrangement of the group graph based upon, at least in part, a hierarchical organization of one or more HDL specifications, HDL libraries 318, 322, 326, design HDL configurations, and/or tool option structures.

Referring again to FIG. 2, in some embodiments, hierarchical HDL library search process 200 may further include generating (204) a search order associated with each of the one or more groups within the group graph. In some embodiments, as tool options are processed, a search order 330 may be associated with each group. The search order may be explicitly given, with a command line option such as –liborder, or may be implicitly given in the tool-specific object which defines the group. The search order 330 may be used during group processing to determine the traversal of the group graph 300.

In some embodiments, the search order 330 associated with each of the one or more groups may include one or more search rules that can be altered based upon, at least in part, the setting of one or more parameters and one or more meta-rule directives. Search rules can be a set of expressions that govern the necessary actions to be taken when resolving an identifier. Search rules may be essentially a language and may include language attributes including, but not limited to, one or more of a constant value, a parameter, and a control statement. In some embodiments, the search rules can be mutable, or in other words, the search rules can be programmed or altered at run time (as opposed to merely running a set of rules). The search rules may be programmed at various stages including, but not limited to, when the library content is created, when the group is formed, and when a search is conducted. In some embodiments, the search rules can be context specific by the setting of one or more parameters or meta-rules directives. A meta-rule directive as used herein may include, but is not limited to, a rule or directive that can determine how other rules, parameters, or control statements, etc. are to be used in a particular context. Context can refer to the scope of an alteration. Examples of scopes of an alteration may include, but are not limited to, within a segment of the HDL (i.e. "when processing this portion of the design, the search rules should be altered this way"), locations in the group graph (i.e. "when this group is encountered, alter the search rules this way"), and when a particular item, or class of items is found (i.e. "when this design element is found, alter the search rules this way"). In one example, the directive "go up" may mean "continue the search at the parent node" and may be redefined to mean "stop the search".

Referring again to FIG. 3, in some embodiments, the search order 330 associated with each of the one or more groups may be based upon, at least in part, the hierarchical design configuration of the group graph 300. In one example as depicted in FIG. 3, a group graph 300 may include one or more groups. A search order associated with the group labeled "HDL" 326 under Group B 314 can include traversing through "Library 2" 322 and "Library 3" 324 of Group B 314, traversing "HDL" 320 and "Library 1" of Group A 312, and then traversing "HDL" 316 of Group C. In other words, the search order 320 associated with one or more groups of a group graph, can be based upon, at least in part, the hierarchical design configuration of the group graph 300. However, other non-hierarchical design configurations can be used for the group graph 300 in accordance with the present disclosure.

Referring again to FIG. 2, in some embodiments, hierarchical HDL library search process 200 may further include identifying (206) one or more undefined references from within a first group of the one or more groups within the group graph. Undefined references as used herein may include, but are not limited to, symbols and or references that may not be identified within one or more groups of a group graph 300 during a search for the symbol or reference. In some embodiments, the one or more undefined references may include, but are not limited to, one or more sets of undefined references identified from one or more groups. Identifying as used herein may include, but is not limited to, searching for a reference and/or defining a reference based upon, at least in part, one or more of the library information and/or design information contained within a group. Accordingly, "searching" or "defining" may be used in place of "identifying", where appropriate and within the scope of the present disclosure.

In some embodiments, during compilation, an undefined reference may be encountered and a search or identification may proceed through the one or more groups following the group graph. The search may start at the current group defined by the source file where the undefined reference occurs. The search rules within the group, and transition to the next group, may be determined by the search order associated with the group. In one example, the search rules for a –y library directory may dictate that the files names in the directory are searched for a matching definition, while filters may be applied based on the file extension. The search order may also specify that the group is treated as a list. In another example, the –f option may be treated as a list of groups, which may in turn contain other groups.

In some embodiments, hierarchical HDL library search process 200 may be local and independent, removing a global found first rule used by many HDL simulators, such as Verilog-XL, IUS, etc. The hierarchical HDL library search process 200 can be executed in parallel, which may remove the serialization introduced by the found first rule. Also, since the search order may follow the design configuration options, as discussed above, it may be more understandable and controllable by the user. Additionally and/or alternatively, since the search may start with a local group of the undefined reference, the reference may be bound to the same definition, regardless of how the subset of the design is embedded in a larger design. A local group, as used herein may include, but is not limited to, where an undefined reference is located within the group graph. This independence may be what a user would expect when building up a large design. In some embodiments, hierarchical HDL library search process 200 may allow independent resolution of undefined references so that dependences are minimized between operations and the maximum parallelism can be achieved.

In some embodiments, hierarchical HDL library search process 200 may apply a unique lookup for each undefined reference based upon, at least in part, the search order associated with the group being searched. Instead of applying the "first found is the only answer" technique, the hierarchical HDL library search process 200 may allow each undefined reference to have a different resolution. A different resolution can occur because the lookup of each undefined reference may have a different search order, which may include, but is not limited to, a different context (e.g. where it is located within the group graph) and a different set of search rules.

In some embodiments, group and/or library resolution may take place within a standard source processing. Resolution as used herein may include, but is not limited to, defining one or more undefined references based upon, at least in part, a known set of references. Accordingly, library resolution as used herein may include, but is not limited to, defining one or more undefined resources based upon, at least in part, the library information and/or design information contained within a group. Library resolution and group processing may be used interchangeably where appropriate and within the scope of the present disclosure.

In some embodiments, library resolution and/or group processing can include one or more phases including, but not limited to, acquiring a group of the one or more groups of the group graph and identifying undefined references from within the group of the one or more groups of the group graph.

Referring again to FIG. 3, in one non-limiting example, HDL 326 of Group B 314 may be acquired. One or more undefined references may be identified within HDL 326. Local resolution may be performed for the one or more undefined references within HDL 326 by defining the undefined references based upon, at least in part, the symbols defined in at least HDL 326. In local resolution, references within a particular design unit may be considered for resolution. In some embodiments, local resolution may include searching for definitions within the design unit. Local resolution may be limited to only those definitions found within the design unit. The design unit may be the unit of information that gets operated on within the local resolution phase. For example, a Verilog module "top" may have within it a reference to "A" and "B", and a definition of "B" (where "B" is defined as a data element of type "reg"). Local resolution may attempt to resolve the reference to "A" (e.g., is a definition provided in "top" for "A"?). In this case because "top" does not include the definition for "A", the resolution of the reference to "A" may be later attempted within the "Resolve Against Registry phase" when "top" is processed there. The reference to "B" may then be considered. Since a definition for "B" exists within "top", the reference for "B" may be defined with the definition in "top".

In some embodiments, local resolution may include acquiring and searching the contents of the local group 314. In other words, local resolution may include acquiring and searching all content from within the local group, Group B 314.

In some embodiments, hierarchical HDL library search process 200 may further include binding (208) one or more defined references to one or more electronic circuit design components. As described above, binding may include, but is not limited to, mapping a symbol or reference to one or more electronic circuit design components. In one example, binding one or more defined references may be based upon, at least in part, one or more binding rules. In some embodiments, the one or more electronic design components can be defined in each of the one or more groups within the group graph. Defined references as used herein may include, but are not limited to, one or more references identified from within a group of the one or more groups. In some embodiments, defined references will be incorporated into a design. In one example, the design can include an electronic circuit design.

In some embodiments, binding one or more defined references to one or more electronic circuit design components may be based upon, at least in part, the hierarchical design configuration of the group graph. In some embodiments of the present disclosure, library binding operations can be independent of local behavior patterns. Additionally and/or alternatively, library binding rules can be composed hierarchically. According to some embodiments of the present disclosure, hierarchical HDL library search process may hierarchically and/or locally bind one or more defined references to one or more electronic circuit design components. Hierarchically and/or locally binding may offer maximum potential parallelism and performance. In some embodiments, hierarchical HDL library search process 200 with hierarchical library binding rules may also be more understandable and controllable by a user, since hierarchical HDL library search process 200 may match the design composition that the users may employ when configuring designs. In some embodiments, the binding rules may follow the hierarchical structure of the design.

In some embodiments, hierarchical HDL library search process 200 may further include identifying (210) the one or more undefined references from within a second group of the one or more groups within the group graph. In some embodiments, hierarchical HDL library search process 200 may be driven by the one or more undefined references. Any reference which may be undefined after local resolution may be deferred for library resolution within another group of the one or more groups within the group graph. In some embodiments, the next group for library resolution (i.e. to be acquired and searched) may be selected based upon, at least in part, the search order associated with the first or local group of the one or more groups. The search order may be dependent on where the undefined reference is located in the group graph, and this information may accompany the undefined reference as it is thrown forward through the hierarchical HDL library search process.

In some embodiments, as the one or more groups are encountered, the contents of the one or more groups may be acquired and searched to see if any of the one or more groups contain the undefined reference. In some embodiments, acquiring the next group may include, but is not limited to, adding one or more design units from one or more groups. In some embodiments, acquiring the contents of the next group from the one or more groups of the group graph can occur anytime including, but not limited to, during and/or after the identification of the one or more undefined references from within the local group. In other words, the next group can be acquired partially concurrently with the searching of a local group.

In some embodiments, a group and/or set of libraries whose contents were acquired, may be searched. Definitions matching unresolved references from within the acquired group may be incorporated into the design, and the remaining undefined references may be deferred for binding to yet another group. The one or more undefined references that are not identified from the next group may include a second set of undefined references. The second set of undefined references may include, but are not limited to, one or more of the first set of undefined references and may include additional undefined references.

In some embodiments, the updated registry may be used to bind the one or more undefined references. The one or more undefined references may be defined based upon, at least in part, the updated registry can be a second set of defined references. In some embodiments, hierarchical HDL library search process 200 may further include binding a second set of defined references to one or more electronic circuit design components.

In some embodiments, hierarchical HDL library search process 200 may further include iteratively processing the one or more groups until at least one of: each of the one or more undefined references may be identified from within the one or more groups; and each of the one or more groups may be used to identify the one or more undefined references and the one or more undefined references may remain unidentified. Hierarchical HDL library search process 200 may include one or more group processing phases. Each group process phase may come into existence when there is more to do in the group system, until either the groups have all been searched and/or all the references have been resolved. As groups of the group graph are processed, any remaining unresolved references left after each iteration may trigger the creation of more group phases, as necessary, causing the entire process to iterate, starting another set of group processing phases.

Another way to think of this process is that each group processing step may start with a set of references and a set of libraries: (R, L). A set of references, R, may be forwarded from the previous iterations. A set of libraries, L, may be derived from the group graph, using the starting points for library search determined by the language processing options given by the tool. In each group processing step, a subset of the references, $R_s$, may be satisfied by the current set of libraries and the library units may be handed on to further language processing steps. The remaining one or more undefined references may be forwarded to the next group processing step, which may be determined using, but not limited to, one or more of the search order associated with each graph of the one or more graphs of the group graph and the hierarchical design configuration of the group graph.

Group processing may continue until either all the undefined references have been resolved, or all the groups of the one or more groups within the group graph have been exhausted. At the end of group processing, each undefined reference may be either resolved and bound, in which case the associated design unit is incorporated into the design, or the reference may not be resolved with the given set of libraries and an appropriate error message may be issued.

Returning to the example with HDL in Group B of FIG. 3, local resolution of HDL 326 within Group B 314 can identify one or more undefined references that may not be bound based upon, at least in part, the library information and/or design information contained within the HDL 326.

In some embodiments, once the one or more undefined references have been bound to one or more definitions, each definition may be available for further processing. This may include error and/or semantic checking, starting with, for example, kind checking, and may use the one or more definitions for traversal operations.

Hierarchical HDL library search process 200 may further include generating a library catalog with information acquired during the identification of the one or more undefined references from within the first group and the identification of the one or more undefined references from within the second group. In some embodiments, looking up an undefined references in a set of libraries may be a potential performance hotspot. During HDL group processing, there may be a large number of references to be looked up within in a large number of libraries. Attention needs to be paid to the cost of individual searches, as well as the latency required to acquire knowledge of the contents of the libraries. The cost of acquiring the information in the libraries may be expected to be the slowest operation, by orders of magnitude. Groups may be expected to be stored on disk, in a network, or in a remote database. There may be significant operations required to determine the contents of the library, such as decrypting, decompressing, and parsing. In addition, it may be expected that when constructing a design hierarchy, libraries will be searched a number of times for matching definitions. This makes it imperative that the information acquired when accessing a library be retained and organized for reuse throughout the construction process. In some embodiments, once all the undefined references have been processed, the library information may be discarded and the memory may be released.

In some embodiments, the hierarchical HDL library search process 200 may also include identifying the one or more undefined references from within a subset of the one or more groups based upon, at least in part, the information within the library catalog. As the contents of groups and/or libraries are acquired they may be organized and retained for subsequent searches. The organization may reflect the organization of the group graph, since that may be an input to determining which definitions are found at any point in the search. This information may be retained in a Library Catalog, which may be organized to allow for efficient searches from the group graph. In other words, based upon, at least in part, the Library Catalog, a subset of the one or more groups of the group graph, can be selected for identifying the one or more undefined references. A subset of the one or more groups as used herein may include, but is not limited to, one or more groups that may yield the source for definitions for the one or more undefined references based upon, at least in part, information maintained by the Library Catalog.

In some embodiments, there may be information regarding definitions found in libraries that should be retained in the Library Catalog for later use. If, for instance, acquiring the definitions of the library also yields source for the definitions which cannot be immediately incorporated into the design hierarchy, it may be retained for later use, rather than having to read the library again to obtain the design unit source. The same may hold for any other information not immediately useful in the design hierarchy.

Besides saving the contents of the library, it may be useful to maintain information regarding the searches performed. Given any point in the source processing, there may be a large number of unresolved references, each of which may need to traverse the library structure to find the correct object. If done naively, this will require O operations, where O can equal N number of searches*M number of libraries. However, as the searches are performed, a group may maintain an associative array reflecting the library search at that point, potentially reducing the size of M to 1, at the cost of maintaining a hash table. Whether that will be useful may depend on the number of unresolved references to be processed, and the number of libraries in that particular group in the library structure. If there are only a few unresolved references, building a hash table for a particular search may be just overhead.

In some embodiments, group processing may offer a speculative execution opportunity. An initial set of libraries may be known at the beginning of the build process. The complete set of libraries may or may not be used, but processing to determine the contents of the libraries may begin immediately on tool invocation, prior to any demand from language processing. This may allow the latency for group acquisition to be spread over more time, starting at the beginning of the build. This would hide some of the library latency and may give faster access to the libraries.

However, as with any speculative execution, there may be a risk that prefetching the library contents may not benefit performance, and in fact could degrade performance because the resources used to acquire library contents may be necessary for other required language processing steps. For instance, a common library format may be a disk file. Reading the library may use disk bandwidth that may also be required for reading an HDL source. If disk bandwidth is the limiting factor in language processing performance, then adding pressure on the disk resource may slow down processing and hurt performance. This may be mitigated if disk reads could be prioritized, with speculative reads given a lower priority.

There may be some use models where prefetching libraries and source files may be useful and may help performance. Interactive systems may provide an environment where prefetching objects from source may almost always improve performance. The timeframe where a user is exploring and developing a software system may offer a much larger time span that may be used to preload files from disk or networks. Preloading source while the user is concerned with investigating may not be noticeable, and may allow much faster processing during the build step, which is where the user may be waiting and aware of the latency. This model may give the user the appearance of greatly improved performance, since the time for prefetching library and source files may be spread over the time of other user operations.

In some embodiments, another way to spread out the latency may be to introduce a separate, explicit preload operation. Taking an abstract view of this, a separate build step may be defined which may move some expensive operator earlier and may allow the results of that operation to be shared by multiple other processing steps. The separate build may be explicitly invoked by the user, and the partitioning of the system for the separate step may also be user defined.

However, there is a tradeoff, and the cost of saving and acquiring the results of the "expensive" operation must be taken into consideration. With current systems, the cost of saving and retrieving information on disk is so high that the operation "saved" may need to be extremely expensive for this to be a viable option. With the relative speed difference between processor and disk speeds, parsing, for instance, may not quality as an expensive operation relative to a disk read.

In some embodiments, there may be potential improvements when considering even disk operations. For instance, a library may reside on a central server via an extremely slow network. In this case, a preprocessing step which may bring the library over to a faster disk could be a useful performance improvement. Or, another case may be if the size of the disk file necessary to encode the information was greatly reduced, that may yield a potential performance improvement.

HDL source files may reside on disk and/or remote networks and can benefit from operations to optimize access performance. Compression using standard Linux utilities may be possible, or utilities customized for HDL files may be developed. Reading standard compression formats directly may have the added benefit that this may be part of an IP delivery mechanism.

Embodiments of the present disclosure may be incorporated in whole or in part into electronic design automation tools. In some embodiments, simulation tools may interact with the hierarchical HDL library search process as part of an automated tool or script for designing electronic circuit components.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for defining and processing hardware description language (HDL) groups for use with an electronic circuit design to be fabricated comprising:
    mapping, using a processor, one or more tool-specific objects into a group graph having one or more groups arranged as nodes in the group graph, wherein each of the one or more groups includes at least one sub-group, library information, and HDL design information, wherein the group graph is configured as a data structure;
    generating a search order associated with each of the one or more groups within the group graph, wherein the search order associated with each of the one or more groups is based upon, at least in part, a hierarchical design configuration of the group graph and wherein the search order is determined, based upon, at least in part, a command line structure;
    identifying one or more undefined references from within a first group of the one or more groups within the group graph;
    binding one or more defined references from within the first group to one or more electronic circuit design components; and
    identifying the one or more undefined references from within a second group of the one or more groups within the group graph, wherein the second group is selected based upon, at least in part, the one or more undefined references and the search order associated with the first group of the one or more groups.

2. The computer-implemented method of claim 1, further comprising:
    acquiring the second group from the one or more groups of the group graph at least partially concurrently with the identification of the one or more undefined references.

3. The computer-implemented method of claim 1, further comprising:
    generating a library catalog with information acquired during the identification of the one or more undefined references from within the first group and the identification of the one or more undefined references from within the second group.

4. The computer-implemented method of claim 3, further comprising:
    identifying the one or more undefined references from within a subset of the one or more groups based upon, at least in part, the information within the library catalog.

5. The computer-implemented method of claim 1, further comprising:
    binding a second set of defined references from within the second group to one or more electronic circuit design components, wherein the second set of defined references includes one or more of the undefined references identified from within the second group.

6. The computer-implemented method of claim 1, further comprising:
    iteratively acquiring each of the one or more groups partially concurrently with the identification of one or more undefined references from the one or more references.

7. The computer-implemented method of claim 6, further comprising:
    iteratively processing the one or more groups until at least one of:
        each of the one or more undefined references is defined; and
        each of the one or more groups is used to identify the one or more undefined references and the one or more undefined references remains undefined.

8. The computer-implemented method of claim 1, wherein the search order associated with each of the one or more groups includes one or more search rules that can be altered based upon, at least in part, the setting of one or more parameters and one or more meta-rule directives.

9. The computer-implemented method of claim 1, wherein the one or more groups include at least one of command lines, tool options, file types, filters, an HDL file, an HDL library, an HDL command line, and an HDL include file.

10. A system for defining and processing hardware description language (HDL) groups for use with an electronic circuit design to be fabricated comprising:
    a computing device having at least one processor configured to map one or more tool-specific objects into a group graph having one or more groups arranged as nodes in the group graph, wherein the group graph is configured as a data structure, wherein each of the one or more groups includes at least one sub-group, library information, and HDL design information, generate a search order associated with each of the one or more groups within the group graph and wherein the search order is determined, based upon, at least in part, a command line structure, wherein the search order associated with each of the one or more groups is based upon, at least in part, a hierarchical design configuration of the group graph, identify one or more undefined references from within a first group of the one or more groups within the group graph, bind one or more defined references from within the first group to one or more electronic circuit design components, and identify the one or more undefined references from within a second group of the one or more groups within the group graph, wherein the second group is selected based upon, at least in part, the one or more undefined references and the search order associated with the first group of the one or more groups.

11. The system of claim 10, wherein the at least one processor is further configured to acquire the second group from the one or more groups of the group graph at least partially concurrently with the identification of the one or more undefined references.

12. The system of claim 10, wherein the at least one processor is further configured to generate a library catalog with information acquired during the identification of the one or more undefined references from within the first group and the identification of the one or more undefined references from within the second group.

13. The system of claim 12, wherein the at least one processor is further configured to identify the one or more references from within a subset of the one or more groups based upon, at least in part, the information within the library catalog.

14. The system of claim 10, wherein the at least one processor is further configured to bind a second set of defined references from within the second group to one or more electronic circuit design components, wherein the second set of defined references includes one or more of the undefined references identified from within the second group.

15. The system of claim 10, wherein the at least one processor is further configured to iteratively acquire each of the one or more groups partially concurrently with the identification of one or more undefined references from the one or more references.

16. The system of claim 10, wherein the at least one processor is further configured to iteratively process the one or more groups until at least one of:
   each of the one or more undefined references is defined; and
   each of the one or more groups is used to identify the one or more undefined references and the one or more undefined references remains undefined.

17. The system of claim 10, wherein the one or more groups include at least one of command lines, tool options, file types, filters, an HDL file, an HDL library, an HDL command line, and an HDL include file.

18. A non-transitory computer-readable storage medium for use with an electronic circuit design to be fabricated, the computer-readable storage medium having stored thereon instructions that when executed by a machine result in the following operations:
   mapping, using a processor, one or more tool-specific objects into a group graph having one or more groups arranged as nodes in the group graph, wherein each of the one or more groups includes at least one sub-group, library information, and HDL design information, wherein the group graph is configured as a data structure;
   generating a search order associated with each of the one or more groups within the group graph, wherein the search order associated with each of the one or more groups is based upon, at least in part, a hierarchical design configuration of the group graph and wherein the search order is determined, based upon, at least in part, a command line structure;
   identifying one or more undefined references from within a first group of the one or more groups within the group graph;
   binding one or more defined references from within the first group to one or more electronic circuit design components; and
   identifying the one or more undefined references from within a second group of the one or more groups within the group graph, wherein the second group is selected based upon, at least in part, the one or more undefined references and the search order associated with the first group of the one or more groups.

19. The computer-readable storage medium of claim 18, wherein operations further comprise:
   acquiring the second group from the one or more groups of the group graph at least partially concurrently with the identification of the one or more undefined references.

20. The computer-readable storage medium of claim 18, wherein operations further comprise:
   generating a library catalog with information acquired during the identification of the one or more undefined references from within the first group and the identification of the one or more undefined references from within the second group.

* * * * *